(12) United States Patent
Mizuhashi

(10) Patent No.: US 7,359,267 B2
(45) Date of Patent: Apr. 15, 2008

(54) METHOD OF TRANSFERRING DATA

(75) Inventor: Hiroshi Mizuhashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/806,350

(22) Filed: Mar. 23, 2004

(65) Prior Publication Data

US 2004/0246771 A1   Dec. 9, 2004

(30) Foreign Application Priority Data

Mar. 24, 2003   (JP) .............................. 2003-079902

(51) Int. Cl.
*G11C 7/00*   (2006.01)
*G11C 7/02*   (2006.01)
(52) U.S. Cl. ...................... 365/205; 365/207; 365/208
(58) Field of Classification Search ................ 365/205, 365/207, 208, 190, 230.03
See application file for complete search history.

(56) References Cited

U.S. PATENT DOCUMENTS

| | | | | |
|---|---|---|---|---|
| 4,893,277 A | * | 1/1990 | Kajigaya et al. ............ | 365/205 |
| 5,233,558 A | * | 8/1993 | Fujii et al. .................... | 365/207 |
| 5,905,685 A | * | 5/1999 | Nakamura et al. .......... | 365/207 |
| 5,973,972 A | * | 10/1999 | Kwon et al. ................. | 365/190 |
| 6,118,718 A | | 9/2000 | Yabe | |
| 6,205,071 B1 | * | 3/2001 | Ooishi ......................... | 365/207 |
| 6,351,423 B2 | * | 2/2002 | Ooishi ......................... | 365/207 |
| 6,445,632 B2 | * | 9/2002 | Sakamoto .................... | 365/207 |
| 6,646,946 B2 | * | 11/2003 | Tomishima et al. ..... | 365/230.03 |
| 6,917,552 B2 | * | 7/2005 | Takemura et al. .......... | 365/205 |
| 6,944,078 B2 | * | 9/2005 | Takemura et al. .......... | 365/207 |
| 7,102,947 B2 | * | 9/2006 | Kajitani et al. ............. | 365/205 |

FOREIGN PATENT DOCUMENTS

| | | |
|---|---|---|
| JP | 08-087879 | 4/1996 |
| JP | 2000-149562 | 5/2000 |

* cited by examiner

*Primary Examiner*—Trong Phan
(74) *Attorney, Agent, or Firm*—Volentine & Whitt, P.L.L.C.

(57) ABSTRACT

A method of storing data includes transferring first data from a data line to a first sense amplifier, transferring the first data from the first sense amplifier to a first bit line, and transferring second data from the data line to a second sense amplifier. In the above operation, a period of the data storing operation of the second data from the data line to the second sense amplifier and a period of the data storing operation of the first data from the first sense amplifier to the first bit line are overlapped.

8 Claims, 7 Drawing Sheets

METHOD OF TRANSFERRING DATA

CROSS REFERENCE TO RELATED APPLICATION

A claim of priority under 35 U.S.C. §119 is made to Japanese Patent Application No. 2003-079902, filed Mar. 24, 2003, which is herein incorporated by reference in its entirety for all purposes.

BACKGROUND OF THE INVENTION

1. Field of the Invention

The present invention relates to a method of writing data to a dynamic random access memory.

2. Description of the Related Art

A synchronous dynamic random access memory must have a large capacity, and must be capable of high-speed operation. However, if the capacity of the memory becomes large, a load on wiring is increased. Therefore, access speed is reduced. To solve this problem, a memory device which has a plurality of memory cell blocks is developed. However, in this memory device, a size of the memory device is increased. Another memory device which has two sets of data buses and read amplifiers has been developed. In such type of memory device, each set is operated alternatively.

Another DRAM for operating high-speed is described in reference 1: Japanese patent Laid-Open No. 8-87879 and reference 2: Japanese Patent Laid-Open No. 12-149562. The reference 1 discloses an SDRAM for visual data which performs a block write operation. In the SDRAM of reference 1, data is written to sense amplifiers while bit lines are disconnected from the sense amplifiers, and then, the data is transferred from the sense amplifiers to the bit lines.

In the DRAM disclosed in reference 2, data is amplified in a sense amplifier after a small voltage which is generated in a bit line pair is transferred to the sense amplifier and the bit line pair is disconnected from the sense amplifier. Therefore, a reading speed is increased.

However, the reference 1 does not disclose a high-speed technique for a general purpose DRAM, because the reference 1 discloses a high-speed technique for a visual data DRAM. Also the reference 2 does not disclose a high-speed writing operation. Therefore a high-speed writing operation for a general purpose DRAM is desired.

SUMMARY OF THE INVENTION

Accordingly, in one aspect of the present invention, a method of storing data includes transferring first data from a data line to a first sense amplifier, transferring the first data from the sense amplifier to a first bit line, and transferring second data from the data line to a second sense amplifier. In the above operation, a period of the data storing operation of the second data from the data line to the second sense amplifier, and a period of the data storing operation of the first data from the first sense amplifier to the first bit line, are overlapped.

DETAILED DESCRIPTION OF THE PREFERRED EMBODIMENTS

Figure 1:
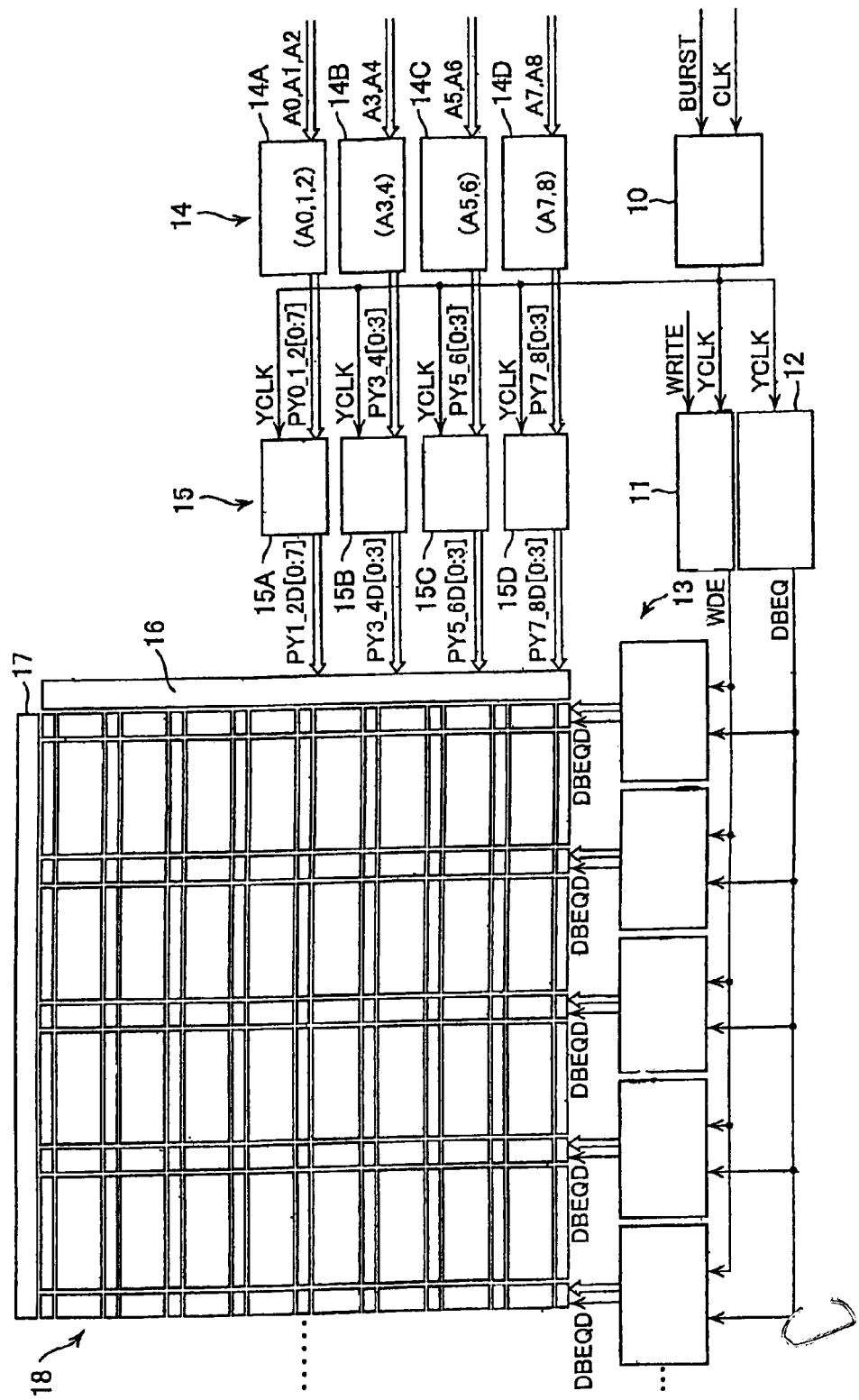
FIG. 1 is schematic diagram showing a synchronous DRAM of a first embodiment of the present invention.

A DRAM according to preferred embodiments of the present invention will be explained hereinafter with reference to the accompanying figures. In order to simplify the explanation, like elements are given like or corresponding reference numerals. Dual explanations of the same elements are avoided.

Figure 2:
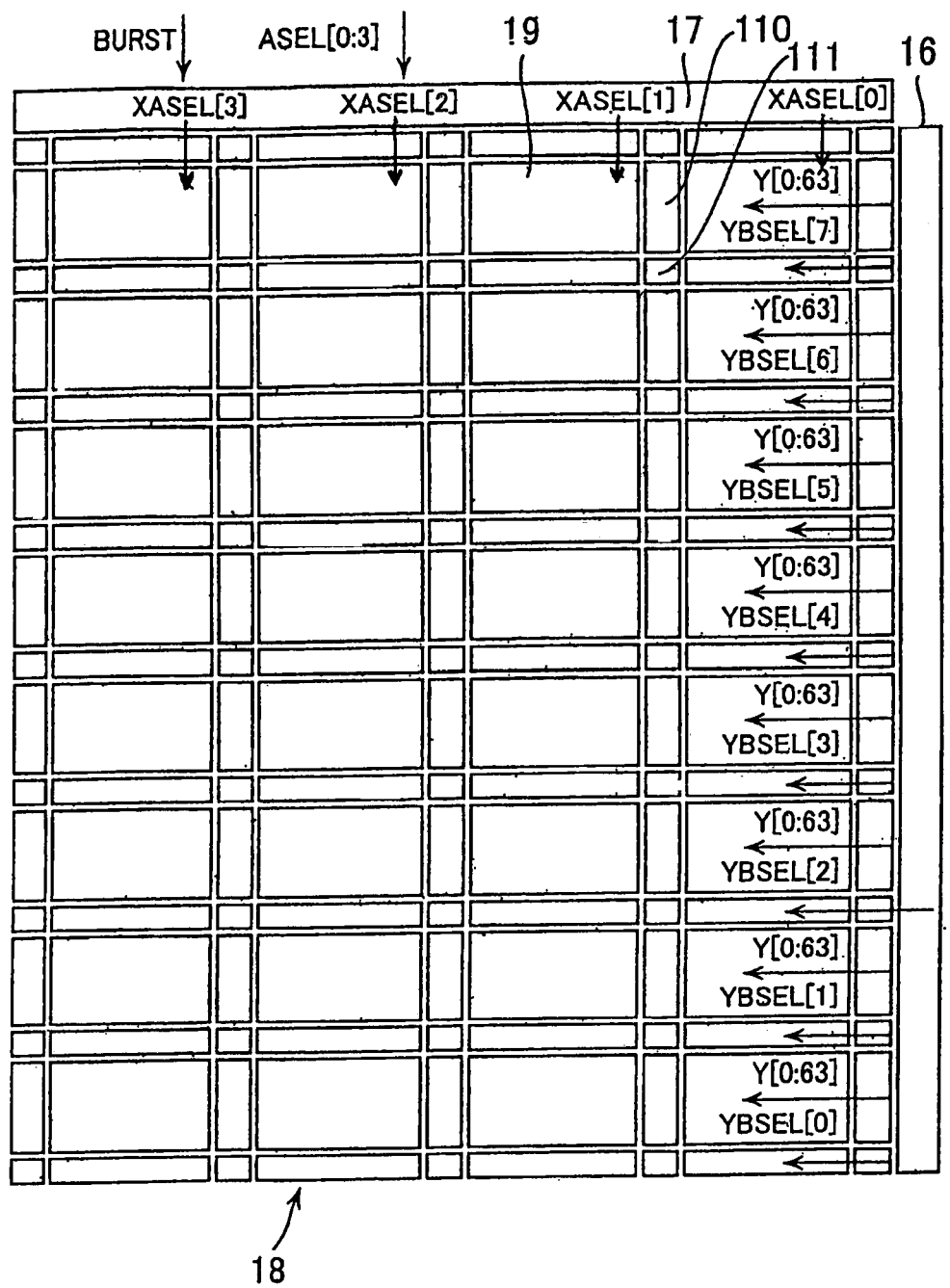
FIG. 2 is a schematic diagram showing a memory cell array of the first embodiment of the present invention.

FIG. 1 is a schematic diagram showing a synchronous dynamic random access memory (SDRAM) of the present invention. FIG. 2 is a schematic diagram showing a memory cell array 18 of the present invention.

The SDRAM includes a memory cell array 18, a column selecting pulse generator 10, a write clock generator 11, a data bus equalizing signal generator 12, write driver & data bus equalizer units 13, pre-decoders 14 respectively including predecoder 14A (A0,1,2) receiving bits A0, A1, and A2 of the address signal, predecoder 14B (A3,4) receiving bits A3 and A4, predecoder 14C (A5,6) receiving bits A5 and A6, and predecoder 14D (A7,8) receiving bits A7 and A8, address drivers 15 respectively including address drivers 15A, 15B, 15C and 15D, a column decoder 16, and a row decoder & main word line driver unit 17.

The memory cell array 18 includes memory cell blocks 19, sense amplifier blocks 110, and control blocks 111 as shown in FIG. 2. Each memory cell block 19 includes 512 word lines, 256 pairs of bit lines, and memory cells arranged at intersections of the word lines and the bit lines. The word lines are extended in a vertical direction and the bit lines are extended in a horizontal direction in FIG. 2. In the memory cell block 19, four pairs of bit lines are connected to a data bus in response to a signal of each column selecting line Y simultaneously. That is, 64 column selecting lines Y are arranged in each memory cell block 19. Eight memory cell blocks 19 are arranged in a direction in which the word line is extended.

The column selecting pulse generator 10 generates a column selecting pulse YCLK in response to a clock signal CLK and a burst signal BURST. The burst signal BURST has a "H" level during a column accessing operation. The write clock generator 11 generates a signal WDE in response to the column selecting pulse YCLK and a signal WRITE. The signal WRITE has the "H" level while a write operation. The data bus equalizing signal generator 12 generates an equalizing signal DBEQ in response to the column selecting signal YCLK. The write driver & data bus equalizer unit 13 transfers an input data to the data bus in response to the signal WDE and equalizes the data bus in response to the equalizing signal DBEQ. The pre-decoders 14 include pre-decoders 14A, 14B, 14C and 14D that respectively pre-decode address signal A0 to A8 and respectively generate pre-decode signals PY0_1_2[0:7], PY3_4[0:3], PY5_6[0:3], and PY7_8[0:3], hereinafter referred to as signals PY0, PY1, PY2, PY3, PY4, PY5, PY6, PY7 and PY8, or collectively for the sake of brevity as PY0-PY8. In this embodiment, the lower three bits (A0 to A2) are used for selecting the memory cell blocks 19 and another six bit (A3 to A8) are used for selecting the column selecting lines Y. In a burst access operation, lower address A0 alternately changes between the "H" and the "L" levels for every column accessing. Therefore, when the column lines are selected sequentially, two consecutive column accessing operations are performed in two respective memory cell blocks 19. The address drivers 15 output the pre-decode signals PY0-PY8 to the column decoder 16 in synchronization with the column selecting pulse YCLK. The column decoder 16 outputs block selecting signals YBSEL[0:7] and the column selecting signals Y[0:63] in response to the pre-decode signals PY0-PY8. The row decoder & main word line driver unit 17 outputs array selecting signals XASEL[0:3] in response to an array selecting signal ASEL[0:3] and the burst signal BURST.

Figure 3:
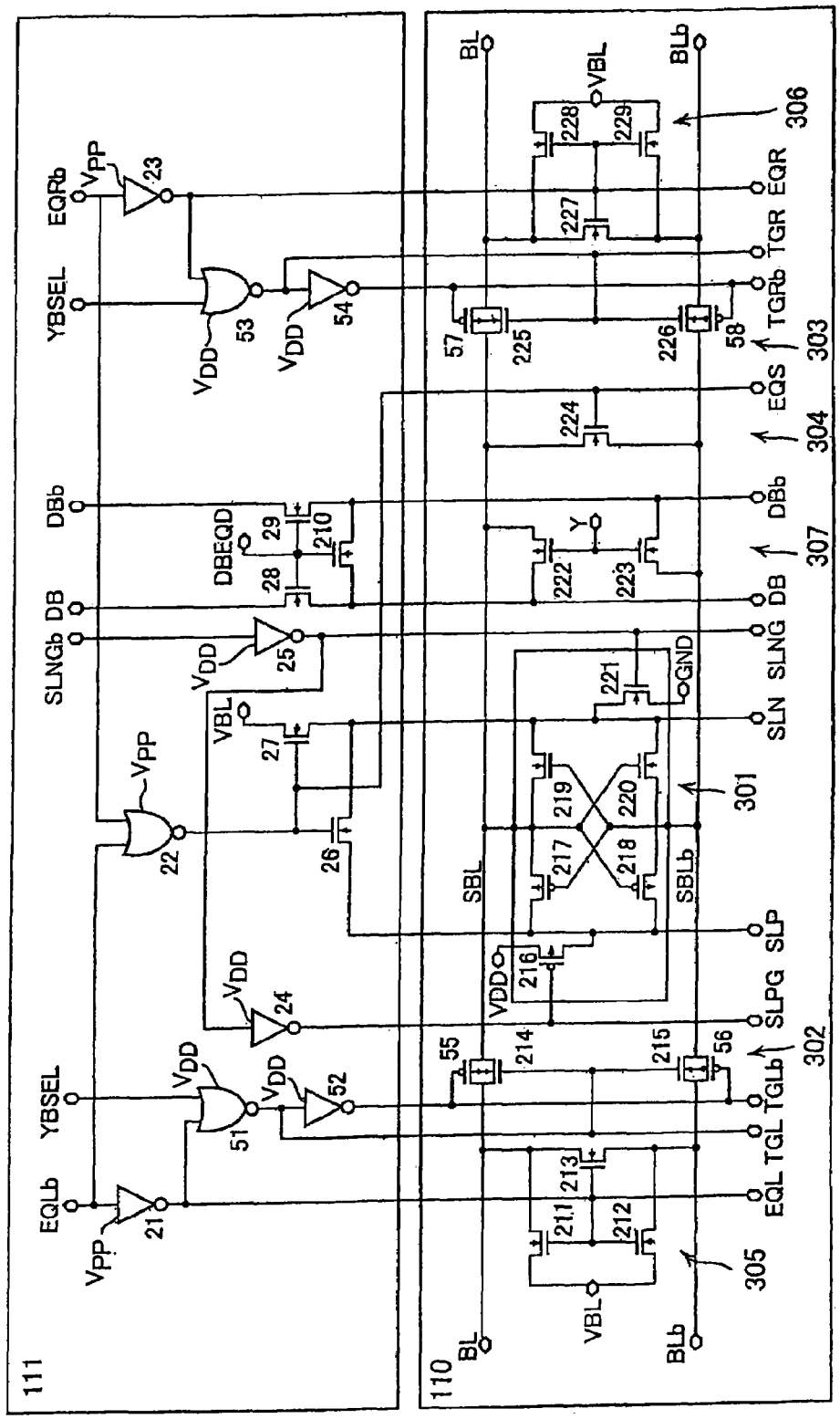
FIG. 3 is a schematic diagram showing a sense amplifier portion and a control block of the synchronous DRAM of the first embodiment.

FIG. 3 is a schematic diagram showing the sense amplifier block 110 and the control block 111.

The sense amplifier block 110 is shared by two memory cell blocks 19 which are adjacent to each side of the sense amplifier block 110. The array selecting signal ASEL[0:3] selects the memory cell block 19 for writing the data from the sense amplifier block 110. The sense amplifier block 110 includes a sense amplifier 301, transfer gates 302 and 303, an equalizing circuit 304, and pre-charge circuits 305 and 306. The sense amplifier 301 includes transistors 217, 218, 219 and 220 and is driven by output signals from inverters 24 and 25, and amplifies a voltage between an input nodes SBL and SBLb to a VDD level and a GND level. Transistor 216 couples line SLP to the VDD level responsive to activating signal SLPG, and transistor 221 couples line SLN to the GND level responsive to activating signal SLNG. The transfer gate 302 includes a P-channel transistor 55 and an N-channel transistor 214, and a P-channel transistor 56 and an N-channel transistor 215. The transfer gate 302 is connected between the sense amplifier 301 and a left bit line pair BL and BLb. The transfer gate 303 includes a P-channel transistor 57 and an N-channel transistor 225, and a P-channel transistor 58 and an N-channel transistor 226. The transfer gate 303 is connected between the sense amplifier 301 and a right bit line pair BL and BLb. The equalizing circuit 304 includes N-channel transistor 224 that equalizes the bit lines BL and BLb to the same level. The pre-charge circuit 305 includes transistors 211 to 213, and pre-charges the left bit lines BL and BLb to a half voltage VBL(VDD/2). The pre-charge circuit 306 includes transistors 227 to 229, and pre-charges the right bit lines BL and BLb to the half voltage VBL(VDD/2). A data bus connection circuit 307 includes transistors 222 and 223, and is connected between the sense amplifier 301 and the data bus DB and DBb.

In the control block 111, inverters 24 and 25 generate activating signals SLPG and SLNG in response to a signal SLNGb. A NOR circuit 22 which is driven by a Vpp level, and transistors 26 and 27, pre-charge the sense amplifier 301 to the half voltage VBL in response to equalizing signals EQLb and EQRb. The Vpp level has a boosted voltage for preventing a voltage drop caused by a threshold voltage of the transistors. An output signal of the NOR circuit 22 is also used for the equalizing signal EQS to drive the equalizing circuit 304. A NOR circuit 51 providing signal TGL and an inverter 52 providing signal TGLb drive the transfer gate 302 by the VDD level in response to the equalizing signal EQLb and the block selecting signal YBSEL. A NOR circuit 53 providing signal TGR and an inverter 54 providing signal TGRb drive the transfer gate 303 by the VDD level in response to the equalizing signal EQRb and the block selecting signal YBSEL.

In this embodiment, the P-channel transistor 55 and the N-channel transistor 214 are connected in parallel between the sense amplifier 301 and the left bit line BL. Therefore, even if the transistors 55 and 214 are driven by the voltage VDD, the data can be transferred without a voltage drop. When the input node SBL is the "H" level, the P-channel transistor 55 which is driven by the VDD level generates the voltage drop Vt caused by the threshold voltage. At the P-channel transistor 214 which is driven by TP the GND level, the voltage drop caused by the threshold voltage does not occur when the input node SBL is the "H" level. As a result, the "H" level of the input node SBL in the sense amplifier 301 can be transferred to the bit line BL without the voltage drop. When the input node SBL is the "L" level, the N-channel transistor 214 generates the voltage drop caused by the threshold voltage. However, the P-channel transistor 55 does not generate the voltage drop when the bit line voltage is the "L" level. As a result, the "L" level of the input node SBL in the sense amplifier 301 can be transferred to the bit line BL without the voltage drop.

Inverters 21 and 23 are driven by the Vpp level, and drive the pre-charge circuits 305 and 306 by producing signals EQL and EQR respectively in response to the equalizing signal EQLb and EQRb. Transistors 28, 29 and 210 are driven by the equalizing signal DBEQD and equalize the data bus DB and DBb.

Figure 4:
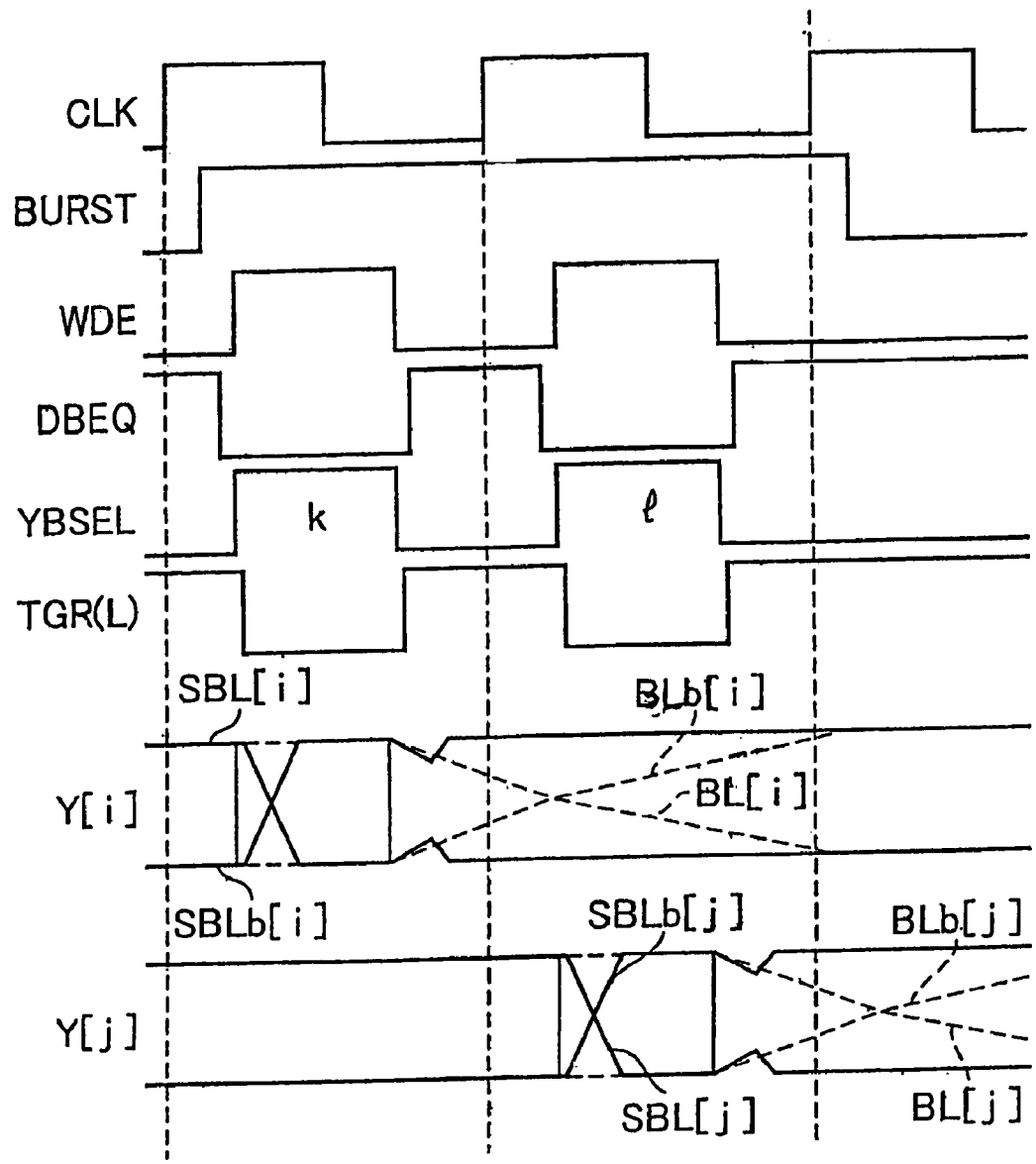
FIG. 4 is a timing chart showing a writing operation of the first embodiment.

Next, a writing operation is described by referring in FIG. 4. In FIG. 4, signals SBL and SBLb show a level of input nodes of the sense amplifier 301, and signals BL and BLb show a level of a node on the bit line pair in the memory cell block 19.

First, the memory cell array is selected by the array selecting signal XASEL[0:3]. Then, the block selecting signal YBSEL[k] and the column selecting signal Y[i] are changed to the "H" level in synchronization with the column selecting pulse YCLK which is generated from the clock signal CLK and the burst signal BURST, wherein YBSEL[k] is indicative of an asserted one of block selecting signals YBSEK[0] to YBSEL[7] and Y[i] is indicative of a corresponding asserted one of column selecting signals Y[0] to Y[63] initially selected for a writing operation. Then, the transistors 222 and 223 are turned on and the data bus DB and DBb are connected to the sense amplifier 301 in response to the "H" level of the column selecting signal Y[i]. The gate signals TGR and TGL are changed to the "L" level in response to the block selecting signal YBSEL, and the sense amplifier 301 is disconnected from the bit line pair BL[i] and BLb[i] by the transfer gates 302 and 303. In FIG. 4, gate signals TGR and TGL are collectively shown as TGR(L) for the sake of brevity, because the pair of signals TGR and TGL provided by a given control block 111 as shown in FIG. 3 have the same values simultaneously responsive to the corresponding block selecting signal YBSEL. That is, data is transferred from the data bus DB and DBb to the input nodes SBL and SBLb of the sense amplifier 301 while the sense amplifier 301 is disconnected from the bit line pair BL[i] and BLb[i]. As a result, the level of the input node SBL of the sense amplifier 301 is changed to the "L" level and the level of the input node SBLb of the sense amplifier 301 is changed to the "H" level immediately.

Then, the TGR is changed from the "L" level to the "H" level in response to the changing of the block selecting signal YBSEL[k] from the "H" level to the "L" level, and the sense amplifier 301 is connected to the bit line pair BL[i] and BLb[i]. As a result, the data latched in the sense amplifier 301 is transferred to the bit line pair BL[i] and BLb[i] gradually.

In response to the "H" level of the block selecting signal YBSEL[l] and the column selecting signal Y[j], wherein YBSEL[l] is indicative of a next asserted one of block selecting signals YBSEL[0] to YBSEL[7], and Y[j] is indicative of a corresponding next asserted one of column selecting signals Y[0] to Y[63] selected for a next writing operation, another sense amplifier 301 in another memory cell block 19 starts latching next data. The another sense amplifier 301 is connected to a bit line pair BL[j] and BLb[j] that is selected by the block selecting signal YBSEL[l] and the column selecting signal Y[j]. The latching operation in the another sense amplifier 301 is started while the writing operation from the sense amplifier 301 to the bit line pair BL[i] and BLb[i] is performed. The memory cell block 19 is selected by the lower address A0 to A2. Therefore, the bit line pair BL[i] and BLb[i] which is selected by the column selecting signal Y[i] and the bit line pair BL[j] and BLb[j] which is selected by the column selecting signal Y[j] are included in the different memory cell blocks respectively. As a result, the data latching operation in the sense amplifier 301 which is connected to the bit line pair BL[j] and BLb[j] which is selected by the column selecting signal Y[j] can be performed while the writing operation for the bit line pair BL[i] and BLb[i] which is selected by the column selecting signal Y[i] is performed.

Figure 5:
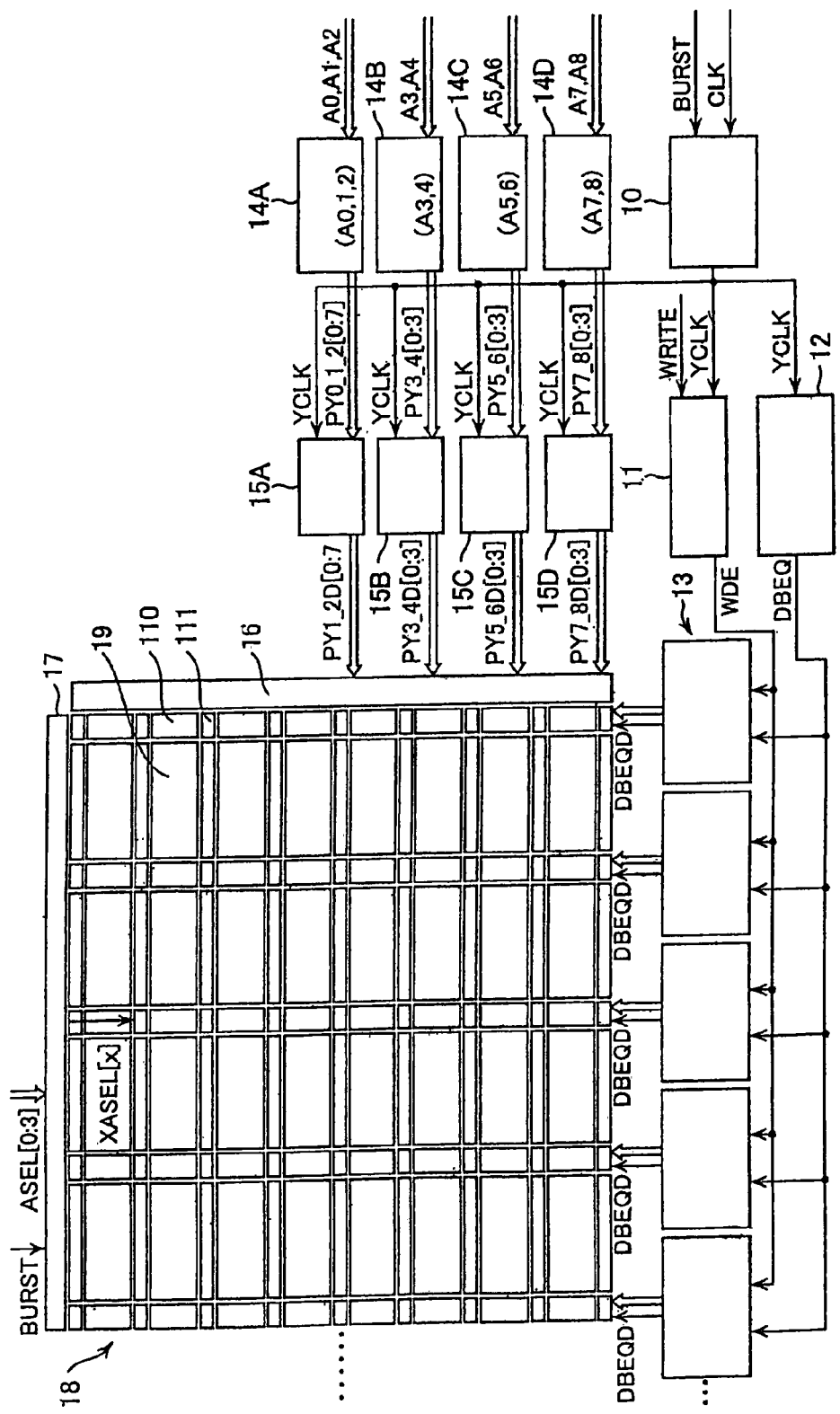
FIG. 5 is a schematic diagram showing a synchronous DRAM of a second embodiment of the present invention.
Figure 6:
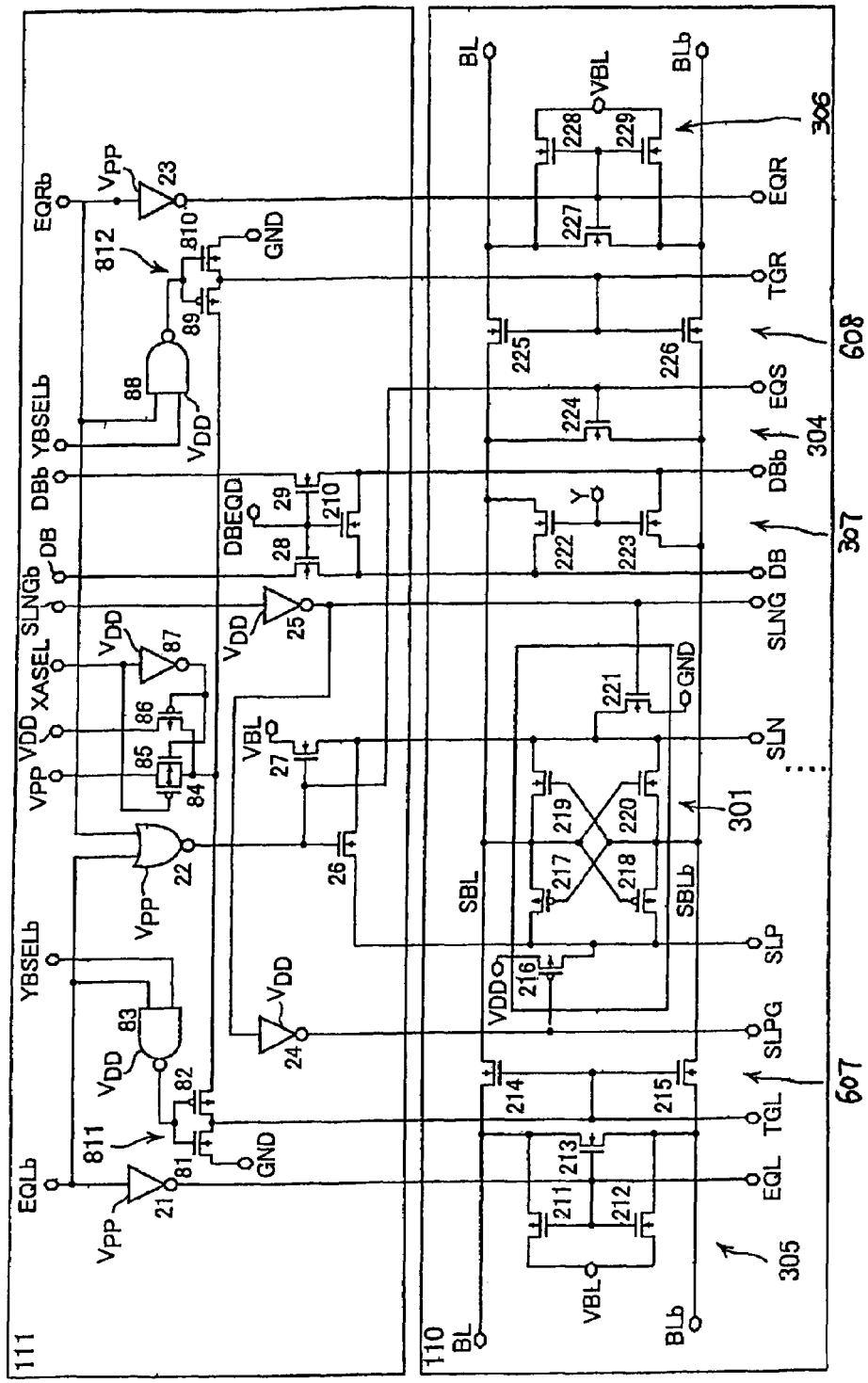
FIG. 6 is a schematic diagram showing a sense amplifier portion and a control block of the synchronous DRAM of the second embodiment.

FIG. 5 is a schematic diagram showing a synchronous DRAM of a second preferred embodiment of the present invention. FIG. 6 is a schematic diagram showing the sense amplifier block 110 and the control block 111 of the synchronous DRAM of the second preferred embodiment. In FIGS. 5 and 6, elements that have the same reference numerals as in respective FIGS. 1 and 3 are the same and function similarly, and thus explanation of such similar circuit elements are here omitted for the sake of brevity.

In this embodiment, a transfer gate 607 includes N-channel transistors 214 and 215 and is driven by an output signal of an inverter 811 which includes transistors 81 and 82. The inverter 811 is driven by an output signal of a NAND circuit 83. The NAND circuit 83 has input thereto an equalizing signal EQLb and the block selecting signal YBSELb. The inverter 811 outputs a GND level or a power supply voltage level. The power supply voltage level is selected from the Vpp level or the VDD level by transistors 84 and 85 or a transistor 86. Also, a transfer gate 608 includes N-channel transistors 225 and 226 and is driven by an output signal of an inverter 812 which includes transistors 89 and 810. The inverter 812 is driven by an output signal of a NAND circuit 88. The NAND circuit 88 has input thereto an equalizing signal EQRb and the block selecting signal YBSELb. The inverter 812 outputs a GND level or a power supply voltage level. The power supply voltage level is selected from the Vpp level or the VDD level by transistors 84 and 85 or a transistor 86. That is, when the array selecting signal XASEL is the "L" level, the transistors 84 and 85 are turned on and supply the Vpp level to the inverters 811 and 812. When the array selecting signal XASEL is the "H" level, the transistor 86 is turned on and supplies the VDD level to the inverters 811 and 812. Inverter 87 inverts array selecting signal XASEL, and provides the inverted signal to the gates of transistors 85 and 86.

The Vpp level in this embodiment has a voltage which does not make a voltage drop between a source electrode and a drain electrode of the N-channel transistors 214, 215, 225 and 226, when the transistors 214, 215, 225 and 226 are driven by the VDD level. The VDD level in this embodiment is lower than the Vpp level and has a voltage which make a voltage drop between the source electrode and the drain electrode of the N-channel transistors 214, 215, 225 and 226, when the transistors 214, 215, 225 and 226 are driven by the VDD level.

Figure 7:
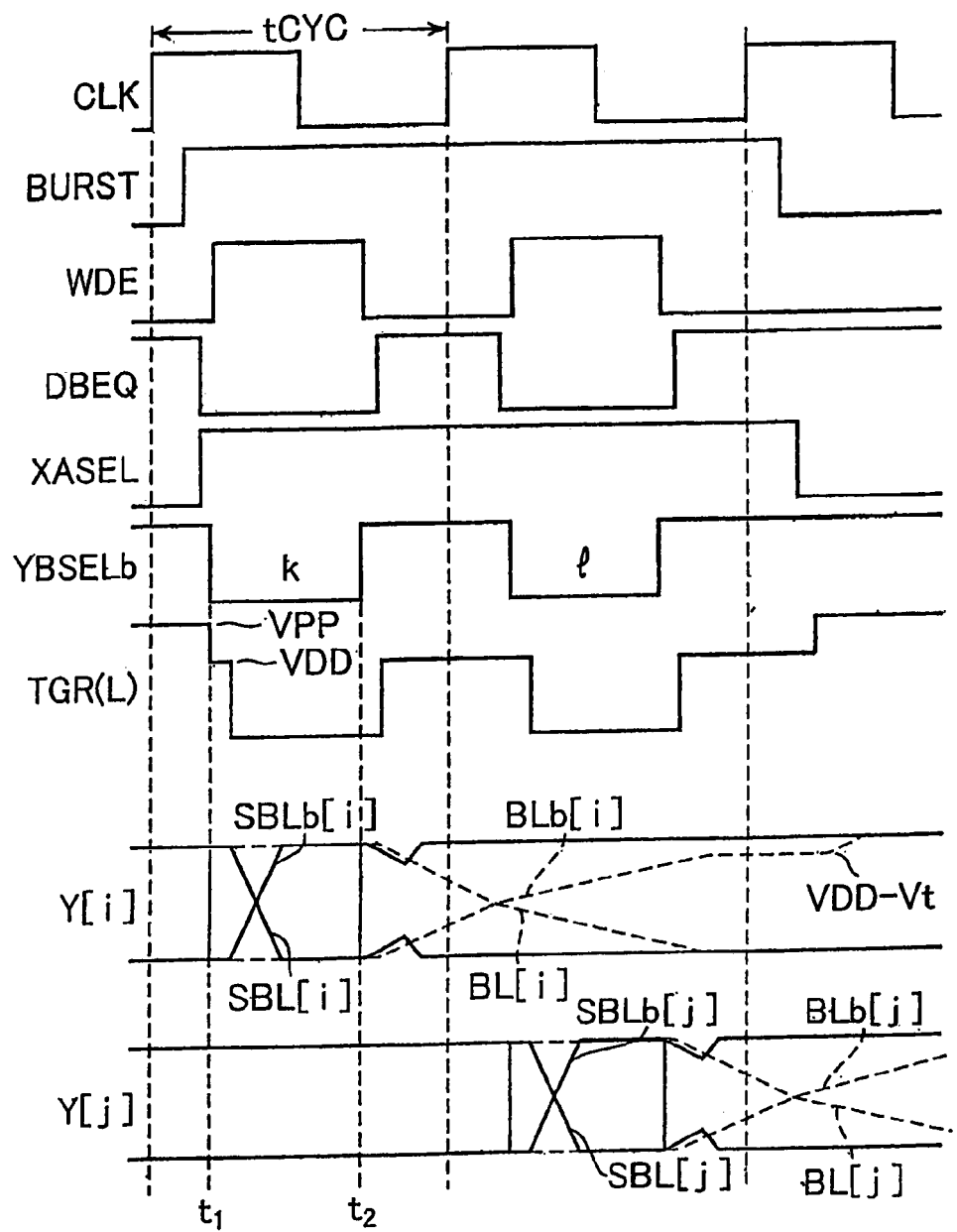
FIG. 7 is a timing chart showing writing operation of the second embodiment.

Next, a writing operation is described by referring to FIG. 7 which shows among other signals a clock signal CLK having clock cycle tCYC.

First, the burst signal BURST changes to the "H" level. Then, the array selecting signal XASEL is changed from the "L" level to the "H" level. While the array selecting signal XASEL has the "L" level, the power supply voltage in the inverters 811 and 812 is Vpp. While the array selecting signal XASEL has the "H" level, the power supply voltage in the inverters 811 and 812 is VDD. Accordingly, when the level of the array selecting signal XASEL changes from the "L" level to the "H" level, an amplitude of the signal TGR changes from a range between the GND level and the Vpp to a range between the GND level and the VDD level.

When the block selecting signal YBSELb[k] changes from the "H" level to the "L" level, the column selecting signal Y[i] changes to the "H" level and the signal TGR is changed to the "L" level. In response to the "H" level of the column selecting signal Y[i] and the "L" level of the signal TGR, the sense amplifier 301 is connected to the data bus DB and DBb and the sense amplifier 301 is disconnected from the bit line pair BL[i] and BLb[i]. Then, the column selecting signal Y[i] is changed to the "L" level and the signal TGR is changed to the "H" level. In response to the "L" level of the column selecting signal Y[i], the sense amplifier 301 is disconnected from the data bus DB and DBb, and in response to the "H" level of the signal TGR, the sense amplifier 301 is connected to the bit line pair BL[i] and BLb[i]. Then, the data which is latched in the sense amplifier 301 is transferred to the bit line pair BL[i] and BLb[i].

In this operation, the transistor 226 is driven by the voltage which has the VDD level. Therefore, the data which is latched in the sense amplifier 301 is transferred to the bit line pair BL[i] and BLb[i] with the voltage drop Vth. As a result, the bit line pair BL[i] and BLb[i] is charged to a VDD-Vt level. After the writing operation is completed, the array selecting signal XASEL is changed to the "L" level in response to the "L" level of the burst signal BURST. In response to the "L" level of the array selecting signal XASEL, the power supply voltage in the inverters 811 and 812 is changed to the Vpp level. Accordingly, the transistor 226 is driven by the Vpp level, the bit line BLb is charged to VDD.

Then, the block selecting signal YBSEL[l] and the column selecting signal Y[j] are changed to the "H" level. In response to the "H" level of the block selecting signal YBSEL[l] and the column selecting signal Y[j], another sense amplifier 301 in another memory cell block 19 starts latching next data. The another sense amplifier 301 is connected to a bit line pair BL[j] and BLb[j] that is selected by the block selecting signal YBSEL[l] and the column selecting signal Y[j]. The latching operation in the another sense amplifier 301 is started while the writing operation from the sense amplifier 301 to the bit line pair BL[i] and BLb[i] is performed. The memory cell block 19 is selected by the lower address A0 to A2. Therefore, the bit line pair BL[i] and BLb[i] which is selected by the column selecting signal Y[i], and the bit line pair BL[j] and BLb[j] which is selected by the column selecting signal Y[j], are included in different memory cell blocks respectively. As a result, the data latching operation in the sense amplifier 301 which is connected to the bit line pair BL[j] and BLb[j] which is selected by the column selecting signal Y[j] can be performed while the writing operation for the bit line pair BL[i] and BLb[i] which is selected by the column selecting signal Y[i] is performed.

Accordingly, the N-channel transistors 214, 215, 225 and 226 are driven by the VDD level and the Vpp level, the data latched in the sense amplifier can be transferred to the bit line pair without using P-channel transistors.

While the preferred form of the present invention has been described, it is to be understood that modifications will be apparent to those skilled in the art without departing from the spirit of the invention. The scope of the invention is to be determined solely by the following claims.

What is claimed is:

1. A method of storing data comprising:
    connecting a data line to a first sense amplifier when a first bit line is disconnected from the first sense amplifier;
    connecting the first sense amplifier to the first bit line when the data line is disconnected from the first sense amplifier; and
    connecting the data line to a second sense amplifier when the first bit line is connected to the first sense amplifier,
    wherein the first bit line is connected to the first sense amplifier via a switching transistor, and wherein the switching transistor is driven to be on during a writing operation by a first signal that changes between a ground level and a first voltage, and is then driven to be on after the writing operation by a second signal that changes between the ground level and a second voltage, the second voltage is higher than the first voltage.

2. The method of claim 1, further comprising connecting the second sense amplifier to a second bit line when the second sense amplifier is disconnected from the data line.

3. The method of claim 2, wherein the second bit line is included in a memory cell array block that is different from a memory cell array block in which the first bit line is included.

4. A method of storing data comprising:
    transferring first data from a data line to a first sense amplifier when a first bit line is disconnected from the first sense amplifier;
    transferring the first data from the first sense amplifier to the first bit line after the first sense amplifier is disconnected from the data line;
    transferring second data from the data line to a second sense amplifier when the first bit line is connected to the first sense amplifier; and
    transferring the second data from the second sense amplifier to a second bit line after the second sense amplifier is disconnected from the data line,
    wherein the first data is transferred from the first sense amplifier to the first bit line via a switching transistor, wherein the switching transistor is driven during a writing operation by a first signal that changes between a ground level and a first voltage, and is then driven after the writing operation by a second signal that changes between the ground level and a second voltage, the second voltage is higher than the first voltage.

5. The method of claim 4, wherein the second bit line is included in a memory cell array block that is different from a memory cell array block in which the first bit line is included.

6. A method of storing data comprising:
    transferring first data from a data line to a first sense amplifier, wherein the first data is latched in the first sense amplifier;
    transferring the first data from the first sense amplifier to a first bit line; and
    transferring second data from the data line to a second sense amplifier, wherein the second data is latched in the second sense amplifier,
    wherein a period of latching the second data from the data line to the second sense amplifier, and a period of transferring the first data from the first sense amplifier to the first bit line, are overlapped,
    wherein the first data is transferred from the first sense amplifier to the first bit line via a switching transistor, wherein the switching transistor is driven by a first signal that changes between ground level and a first voltage, and is then driven by a second signal that changes between the ground level and a second voltage, the second voltage is higher than the first voltage.

7. The method of claim 6, wherein the second bit line is included in a memory cell array block that is different from a memory cell array block in which the first bit line is included.

8. A method of transferring data comprising:
    supplying a first signal that changes between a ground level and a first voltage to a switching transistor which is connected between a sense amplifier and a bit line, wherein data having a voltage drop caused by a threshold voltage of the switching transistor is transferred from the sense amplifier to the bit line by the switching transistor responsive to the first voltage; and
    supplying a second signal that chances between the ground level and a second voltage to the switching transistor, wherein the data which does not have a voltage drop caused by the threshold voltage of the switching transistor is transferred from the sense amplifier to the bit line responsive to the second voltage, the second voltage is higher than the first voltage.

* * * * *